(12) United States Patent
Uemura et al.

(10) Patent No.: US 6,734,468 B2
(45) Date of Patent: May 11, 2004

(54) DEVICES RELATED TO ELECTRODE PADS FOR P-TYPE GROUP III NITRIDE COMPOUND SEMICONDUCTORS

(75) Inventors: Toshiya Uemura, Aichi-ken (JP); Naoki Shibata, Aichi-ken (JP); Shizuyo Noiri, Aichi-ken (JP); Shigemi Horiuchi, Aichi-ken (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 0 days.

(21) Appl. No.: 08/866,129

(22) Filed: May 30, 1997

(65) Prior Publication Data

US 2002/0000643 A1 Jan. 3, 2002

(30) Foreign Application Priority Data

May 31, 1996 (JP) ............................................ 08/160885

(51) Int. Cl.[7] .............................................. H01L 33/00
(52) U.S. Cl. ........................................... 257/99; 257/94
(58) Field of Search ............................................ 257/13

(56) References Cited

U.S. PATENT DOCUMENTS 5,408,120 A * 4/1995 Manabe et al. ............. 257/431
5,563,422 A * 10/1996 Nakamura et al. ........... 257/13
5,777,350 A * 7/1998 Nakamura et al. ........... 257/96

FOREIGN PATENT DOCUMENTS

| JP | 355009442 A | * | 1/1980 |
| JP | 62-34449 | | 2/1987 |
| JP | 05-291-621 | | 11/1993 |
| JP | 6-151968 | | 5/1994 |
| JP | 06-314822 | | 8/1994 |
| JP | 06-275868 | | 9/1994 |
| JP | 07-106633 | | 4/1995 |
| KR | 94-25052 | | 11/1994 |

OTHER PUBLICATIONS

Foresi et al. "Metal contacts to gallium nitride" Applied Physics Letters 52(22), May 31, 1993, p2859–2861.

* cited by examiner

Primary Examiner—Douglas Wille
(74) Attorney, Agent, or Firm—McGinn & Gibb, PLLC (57) ABSTRACT

An electrode pad for a Group III nitride compound semiconductor having p-type conduction includes a triple layer structure having first, second, and third metal layers, formed on an electrode layer. A protection film with a window exposing a central portion of the third metal layer is formed by etching on the third metal layer and covers the sides of the first, second, and third metal layers. The second metal layer is made of gold (Au). The first metal layer is made of an element which has ionization potential lower than gold (Au). The third metal is made of an element which has adhesiveness to the protection film stronger than that of gold (Au). Consequently, this structure of the electrode pad improves the adhesive strength between the protection layer and the third meal layer and prevents the etching of the sides of the protection film. Furthermore, the contact resistance between the semiconductor and the electrode pad is lowered and, thus, ohmic characteristic of the electrode pad is improved.

10 Claims, 3 Drawing Sheets

DEVICES RELATED TO ELECTRODE PADS FOR P-TYPE GROUP III NITRIDE COMPOUND SEMICONDUCTORS

BACKGROUND OF THE INVENTION

1. Field of the Invention

The present invention relates to electrode pads for a Group III nitride compound semiconductor having p-type conduction, a Group III nitride compound semiconductor device having this type of electrode pads, and methods of forming these electrode pads. In particular, the invention relates to electrode pads for a Group III nitride compound semiconductor having p-type conduction with improved adhesive strength and luminous efficiency. Further, the invention relates to a method for forming the electrode pads and preventing the side etching of a protection film when forming a window through the protection film by etching.

2. Description of Background Information

Conventionally, gold (Au) deposited on a surface of a p-type conductive gallium nitride (GaN) layer is used as an electrode. Because the adhesive strength between the Au layer and the GaN layer is weak, an electrode layer made of Au peels easily away from the GaN layer during alloying processes performed on the GaN layer.

As a means to improve the adhesive strength, an electrode with a double layer structure is employed interposing a nickel (Ni) layer between the Au electrode layer and the GaN layer.

Figure 5A:
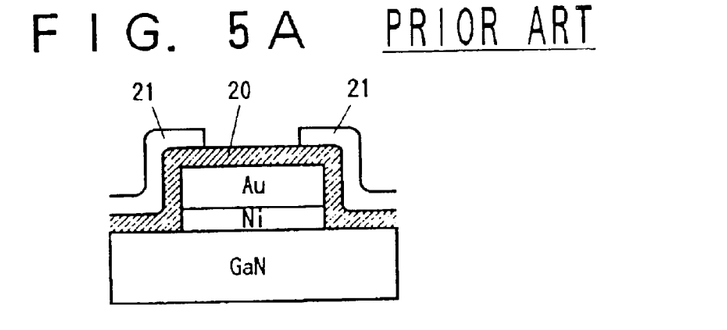
FIGS. 5A and 5B are sectional views showing structure of electrode pads in the prior art.
Figure 5B:
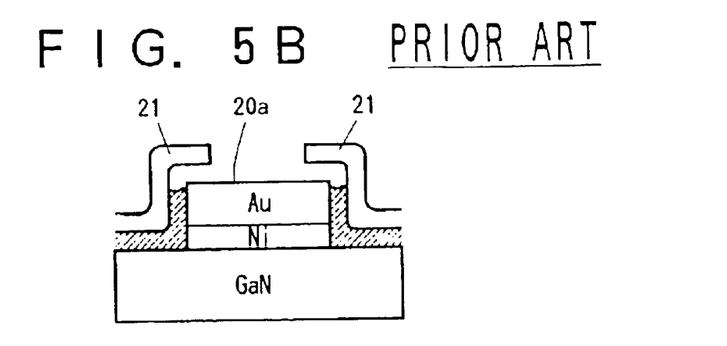

The electrode made of the Ni layer and the Au layer formed thereon also functions as an electrode pad for wire bonding. As shown in FIG. 5A, the semiconductor device is uniformly covered with a protection layer 20 to protect the surface of the device. As shown in FIGS. 5A and 5B, mask layers 21 are formed exposing some part of the protection layer 20 over the Au layer. The exposed portion of the protection layer 20 is removed by etching to form a window 20a. A lead wire is bounded to the electrode pad of the window 20a.

However, because the adhesive strength between the Au layer and the protection layer 20 is weak, etching liquid penetrates between them. Thus, some part of the protection layer 20, even a part which is under the mask layers 21 are removed as shown in FIG. 5B. As a result, forming the window 20a as planned is difficult.

SUMMARY OF THE INVENTION

An object of the present invention is, therefore, to obtain an electrode pad strongly adhered to respective the Group III nitride compound semiconductor and the protection film.

Another object of the present invention is to improve ohmic characteristic of the electrode layer. The ohmic characteristic is defined as figure of volt-ampere (VI) characteristic. Improved ohmic characteristic includes fine linearity of VI characteristic and small contact resistance.

Further object of the present invention is to improve adhesive strength between the electrode layer and the Group III nitride compound semiconductor.

Further object of the present invention is to improve luminous intensity achieved by improvement in effective current density.

The Group III nitride compound semiconductor satisfies the formula $Al_xGa_yIn_{1-x-y}N$, wherein $0 \leq x \leq 1$, $0 \leq y \leq 1$, and $0 \leq x+y \leq 1$.

A first aspect of the present invention is directed to an electrode pad for a Group III nitride compound semiconductor having a p-type conduction. The electrode pad successively includes a first metal layer formed on one of the semiconductor layer and an electrode layer, a second metal layer formed on the first metal layer, and a third metal layer formed on the second metal layer. A protection film is formed covering over the surface of the device and exposing a central portion of the third metal layer. The second metal layer is made of gold (Au). A composite element of the first metal layer has an ionization potential lower than gold (Au), and a composite element of the third metal layer has adhesiveness to the protection film stronger than gold (Au).

The composite element of the first metal layer should preferably be at least one of nickel (Ni), Iron (Fe), copper (Cu), chromium (Cr), tantalum (Ta), vanadium (V), manganese (Mn), aluminum (Al), and silver (Ag). The composite element of the third metal layer should preferably be at least one of aluminum (Al), nickel (Ni), and titanium (Ti). Further, the protection film should preferably be made of silicon oxide eg., SiO, $SiO_2$, and $Si_2O_{S3}$ or silicon nitride e.g., $SiN_2$ and $Si_3N_4$. The most preferable combination of the composite metals for the electrode pad is the first metal layer comprising nickel (Ni), the second metal layer comprising gold (Au), and the third metal layer comprising aluminum (Al).

The electrode pad with the above identified structure may be formed directly on the semiconductor layer or on the electrode layer formed on the semiconductor layer depending on purposes. An LED, for example, requires an electric current to flow through a semiconductor layer vertically and uniformly for increasing an emission area. In this case, an electrode layer formed on the semiconductor layer is fairly wider than the electrode pad.

In order to improve an ohmic characteristic including lowering contact resistance, and Increase the adhesive strength between the electrode layer and the semiconductor layer, the electrode layer should preferably have a multi-layer structure at least comprising a first electrode layer formed on the semiconductor layer and a second electrode layer formed on the first electrode layer. The first electrode layer comprises an element that has an ionization potential that is lower than that of the second electrode layer and the second electrode layer comprises an element which has an ohmic characteristic to the semiconductor layer better than that of the first electrode layer. Heat treatment for alloying process of the semiconductor makes the element of the second electrode layer distributed more deeply into the semiconductor layer than that of the first electrode layer. Namely, the order of distribution of the elements is reversed by heat treatment. Before heat treatment, the element of the second electrode layer exists on that of the first electrode layer. After heat treatment, however, the element of the second electrode layer exists below that of the first electrode layer. The discovery of this phenomena is another aspect of the present invention.

The reversal of element distribution, however, does not occur at some portion of the electrode layer which is covered with an electrode pad. Accordingly, the portion of the electrode layer under the electrode pad has a poor ohmic characteristic i.e., a high contact resistance, and thus, flow of electric current detours around this portion This structure contributes to an improved luminous efficiency. Since emitted light under non-transparent electrode pad cannot be emitted outside, utilizing this structure enables the electric current to flow to effective portions of a device so that emitted light can extend outside. Consequently, enlarging effective current density improves luminous efficiency. In view of the improved luminous efficiency, the protection film is not necessary and the electrode pad may be formed In a double or a single layer structure.

The first electrode layer should preferably be made of at least one of nickel (Ni), iron (Fe), copper (Cu), chromium (Cr), tantalum (Ta), vanadium (V), manganese (Mn), aluminum (Al), and silver (Ag), and the second electrode layer be at least one of palladium (Pd), gold (Au), iridium (Ir), and platinum (Pt). The most preferable combination of the composite metals of the electrode layer is the first electrode layer comprising nickel (Ni) and the second electrode layer comprising gold (AU). In this case, heat treatment reverses the relative positions of Ni and Au. Gold (Au) moves deeper with respect to the semiconductor layer than nickel (Ni). Heat treatment may preferably be carried out at a temperature generally ranging from 400° C. to 700° C.

As another aspect of the present invention, the Group III nitride compound semiconductor device using the above described electrode pads includes one of a light-emitting diode (LED), a laser diode (LD), and a transistor.

Because the composite metal of the first metal layer has an ionization potential that is lower than that of a second metal electrode layer, a strong adhesive strength of the metal layer to the semiconductor can be maintained. A protection film formed on the third metal layer covering the sides of the first, second, and third metal layers has a strong adhesive strength to the third metal layer. Accordingly, etching the inner sides of the protection film can be prevented during an etching process to remove sore portion of the protection film. As a result, the protection film can function as intended.

Further, the electrode pad shields the effect of heat treatment to the layers thereunder. The portion of the electrode layer under the electrode pad does not undergo a reversal in its distribution of elements. Accordingly, the contact resistance of some portion of the electrode layer which is under the electrode pad is high, and thus, electric current detours this portion and flows into other parts of the electrode layer. Consequently, luminous efficiency of the device is improved by increasing effective current density for emission.

The other portion of the electrode layer which is not covered with the electrode pad undergoes a reversal in its distribution of elements. Because the element of the first electrode layer has an ionization potential lower than that of the second electrode layer, the first electrode layer has a greater adhesive strength than the second electrode layer. The second electrode layer, which has a work function larger than that of the first electrode layer. That is, the second electrode layer has a higher ionization potential than that of the first electrode layer, and has a better ohmic characteristic to the semiconductor layer. Providing a heat treatment on the electrode layer causes the element of the first electrode layer to move to the surface of the second electrode layer. In particular, the element of the second electrode layer penetrates through the first electrode layer and significantly into the semiconductor layer. A larger portion of the element of the first electrode layer moves and distributes on the surface of the electrode layer. This reversal of the distribution of the elements of the first and the second electrode layers improves both the adhesive strength and the ohmic characteristic between the electrode layer and the semiconductor layer. Particularly, when nickel (Ni) is used as the composite material of the first electrode layer and gold (Au) as that of the second electrode layer, Au penetrates through the Ni first electrode layer. Thus, the ohmic characteristic is improved, i.e., contact resistance is lowered, by using gold (Au) and the adhesive strength between the electrode layer to the semiconductor layer is maintained by using nickel (Ni). On the other hand, some portion of the electrode layer which is under the electrode pad has a high contact resistance, but has enough adhesive strength because Ni remains on the surface of the semiconductor layer.

A Group III nitride compound semiconductor device having an electrode structure as described above improves its device characteristics such as reduction of both applied voltage and contact resistivity and improvement in its reliability. In addition, when the electrode described above is used for an LED and an LD, emission efficiency is improved.

The above and other objects, features, advantages, and characteristics of the present invention are further described in the following detailed description with reference to the accompanying drawings by way of non-limiting exemplary embodiments of the present invention, wherein like reference numerals represent similar parts of the present invention throughout the several views.

DETAILED DESCRIPTION OF EXEMPLARY EMBODIMENTS

The present invention will be more fully understood by reference to the following example.

EXAMPLE

Figure 1:
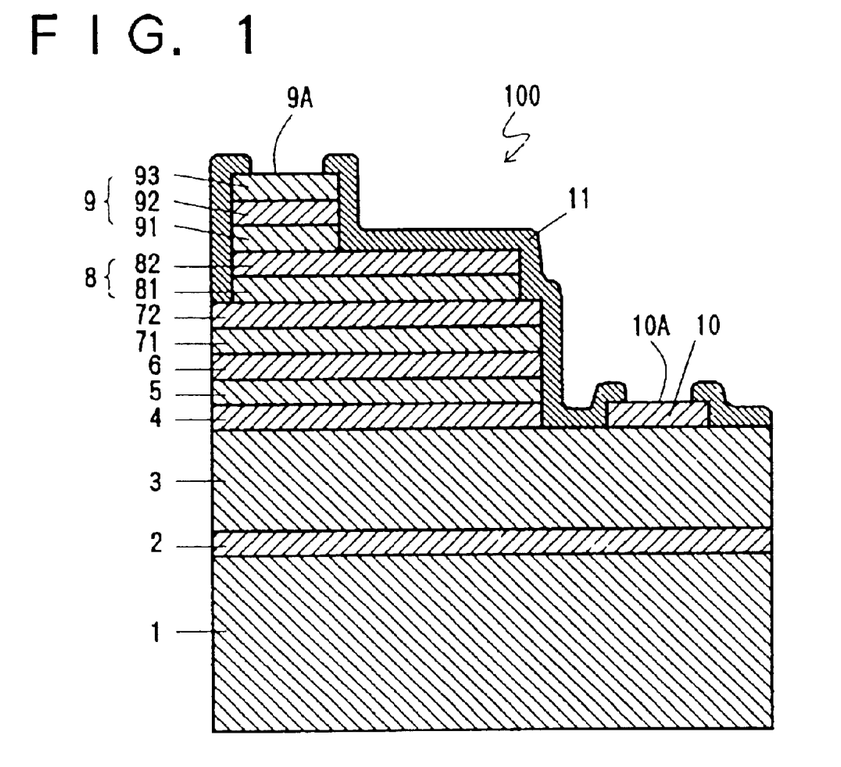
FIG. 1 is a sectional view showing the structure of a light-emitting device in the example set forth below.

FIG. 1 shows a sectional view of a light-emitting device 100 made of Group III nitride compound semiconductor which satisfies the formula: $Al_xGa_yIn_{1-x-y}N$, wherein $0 \leq x \leq 1$, $0 \leq y \leq 1$, and $0 \leq x+y \leq 1$.

The device 100 has a sapphire substrate 1. An AlN buffer layer 2 having a thickness generally of 0.05 $\mu$m was formed on the sapphire substrate 1. A silicon (Si) doped gallium nitride (GaN) layer 3 of $n^+$-type, having a thickness generally of 4.0 $\mu$m and having an electron concentration of $2 \times 10^{18}/cm^3$, was formed on the AlN buffer layer 2. An Si-doped GaN layer 4, having a thickness generally of 0.5 $\mu$m and having an electron concentration of $5 \times 10^{17}/cm^3$, was formed on the $n^+$-layer 3. A zinc (Zn) and Si doped emission layer 5, comprising of $In_{0.20}Ga_{0.80}N$ and having a thickness generally of 100 nm, was formed on the n-layer 4. Respective impurity concentrations of Zn and Si doping were $5 \times 10^{18}/cm^3$. An Mg-doped cladding layer 6 of p-type conduction, comprising of $Al_{0.09}Ga_{0.92}N$ and having a thickness generally of 100 nm, was formed on the emission layer 5. Impurity concentration doped into the cladding layer 6 was $5\times10^{19}/cm^3$ and its hole concentration was $2\times10^{17}/cm^3$. An Mg-doped first contact layer 71, comprised of GaN and having a thickness generally of 200 nm, was formed on the p-type cladding layer 6. Impurity concentration doped into the first contact layer 71 was $5\times10^{19}/cm^3$ and its hole concentration was $3\times10^{17}/cm^3$. An Mg-doped second contact layer 72, comprised of GaN and having a thickness generally of 50 nm, was formed on the first contact layer 71. Impurity concentration doped into the second contact layer 72 was $1\times10^{20}/cm^3$ and its hole concentration was $6\times10^{17}/cm^3$.

A transparent electrode layer 8 was formed on the second contact layer 72. The electrode layer 8 has a double layer structure, comprising a first electrode layer 81 formed on the second contact layer 72 and a second electrode layer 82 formed on the first electrode layer 81. The electrode layer 81 was made of nickel (Ni) and had a thickness generally of 25 Å. The electrode layer 82 was made of gold (Au) and had a thickness generally of 60 Å.

An electrode pad 9 is formed on some portion of the electrode layer 8 and another electrode pad 10 formed on some portion of the n+-layer 3. The electrode pad 9 has a triple layer structure, comprising a first metal layer 91, a second metal layer 92, and a third metal layer 93. The first metal layer 91 was made of Hi and had a thickness generally of 1000 Å. The second metal layer 92 was made of Au and had a thickness generally of 1.5 μm. The third metal layer 93 was made of aluminum (Al) and had a thickness generally of 300 Å. The electrode pad 10 was made of aluminum (Al). An protection layer 11 made of silicon oxide ($SiO_2$) covered the surface of the device 100 exposing some portion of the electrode pads 9 and 10 for wire bonding, as windows 9A and 10A, respectively.

A method for manufacturing the LED 100 is explained hereinafter.

Each layer, from the buffer layer 2 to the second contact layer 72, were formed on the sapphire substrate by gaseous phase epitaxial growth, called metal organic vapor phase deposition (hereinafter MOVPE).

The gases employed in this process are ammonia ($NH_3$), a carrier gas ($H_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), diethyl zinc ($Zn(C_2H_5)_2$) (hereinafter DEZ), and biscyclopentadienyl magnesium ($Mg(C_5H_5)_2$) (hereinafter $CP_2Mg$).

The single crystalline sapphire substrate 1 has a thickness of about 100 μm to 400 μm. After having its main surface 'a' cleaned by an organic washing solvent and heat treatment, the sapphire substrate 1 was placed on a susceptor in a reaction chamber for the MOVPE treatment. Then the sapphire substrate 1 was baked at 1100° C. by $H_2$ vapor fed into the chamber at a flow rate of 2 liter/min. under normal pressure for a period of 30 min.

An AlN buffer layer 2, having a thickness of about 0.05 μm, was formed on the main surface 'a' of the baked sapphire substrate 1 under conditions controlled by lowering the temperature in the chamber to 400° C., keeping the temperature constant, and concurrently supplying for a period of 90 sec. $H_2$ at a flow rate of 20 liter/min., $NH_3$ at 10 liter/min., and TMA at $1.8\times10^{-5}$ mol/min.

An Si-doped GaN layer, having a thickness of about 4.0 μm, was formed on the buffer layer 2, as an n+-layer 3 of high carrier concentration with a Si concentration of about $4\times10^{18}/cm^3$ and an electron concentration of about $2\times10^{18}/cm^3$, under conditions controlled by keeping the temperature of the sapphire substrate 1 at 1150° C. and concurrently supplying for 40 min. $H_2$ at a flow rate of 20 liter/min., $NH_3$ at 10 liter/min., TMG at $1.7\times10^{-4}$ mol/min., and silane diluted to 0.86 ppm by $H_2$ at $20\times10^{-8}$ mol/min.

An Si-doped GaN layer, having a thickness of about 0.5 μm, was formed on the n−-layer 3, as an n-type layer 4 with a Si concentration of about $1\times10^{18}/cm^3$ and an electron concentration of about $5\times10^{17}/cm^3$, under conditions controlled by keeping the temperature of the sapphire substrate 1 at 1100° C. and concurrently supplying for 30 min. or less $H_2$ at a flow rate of 20 liter/min., $NH_3$ at 10 liter/min, TMG at $1.12\times10^{-4}$ mol/min., and silane diluted to 0.86 ppm by $H_2$ at $10\times10^{-9}$ mol/min.

An $In_{0.20}Ga_{0.80}N$ layer, having a thickness of about 100 nm, was formed on the n-type cladding layer 4 as emission layer 5 with respective Si and Zn concentrations of about $5\times10^{18}/cm^3$ under conditions controlled by keeping the temperature of the sapphire substrate 1 at 800° C. and concurrently supplying for 30 min. $H_2$ at a flow rate of 20 liter/min., $NH_3$ at 10 liter/min., TMG at $0.2\times10^{-4}$ mol/min., TMI at $1.6\times10^{-4}$ mol/min., and silane diluted to 0.86 ppm by $H_2$ at $10\times10^{-8}$ mol/min.

An Mg-doped $Al_{0.08}Ga_{0.92}N$ layer, having a thickness of 100 nm and serving as a p-type cladding layer 6, was formed on the emission layer 5 under conditions controlled by keeping the temperature of the sapphire substrate 1 at 1100° C. and concurrently supplying for 6 min. $H_2$ at a flow rate of 20 liter/min., $NH_3$ at 10 liter/min., TMG at $1.12\times10^{-4}$ mol/min., TMA at $0.47\times10^{-4}$ mol/min., and $CP_2Mg$ at $2\times10^{-5}$ mol/min. The resistivity of the cladding layer 6 was $10^8$ Ω.cm or more, exhibiting insulating characteristics. The impurity concentration of Mg doped into the cladding layer 6 was $5\times10^{19}/cm^3$.

An Mg-doped GaN layer, having a thickness about 200 nm and serving as a first contact layer 71, was formed on the cladding layer 6 under conditions of keeping the temperature of the sapphire substrate 1 at 1100° C. and concurrently supplying for 1 min, $H_2$ at a flow rate of 20 liter/min., $NH_3$ at 10 liter/min., TMG at $1.12\times10^{-4}$ mol/min., and $CP_2Mg$ at $2\times10^{-5}$ mol/min. The resistivity of the first contact layer 71 was $10^8$ Ω.cm or more, exhibiting insulating characteristics. The impurity concentration of Mg doped into the first contact layer 71 was $5\times10^{19}/cm^3$.

An Mg-doped GaN layer, having a thickness of about 50 nm and serving as a second contact layer 72, was formed on the first contact layer 71 under conditions of keeping the temperature of the sapphire substrate 1 at 1100° C. and concurrently supplying for 3 min. $H_2$ at a flow rate of 20 liter/min., $NH_3$ at 10 liter/min., TMG at $1.12\times10^{-4}$ mol/min., and $CP_2Mg$ at $4\times10^{-5}$ mol/min. The resistivity of the second contact layer 72 was $10^8$ Ω.cm or more, exhibiting insulating characteristics. The impurity concentration of Mg doped into the first contact layer 71 was $1\times10^{20}/cm^3$.

Then, electron rays were uniformly irradiated into the second contact layer 72, the first contact layer 71, and the cladding layer 6 using a reflective electron beam diffraction device. The irradiation conditions were set at 10 kV for the accelerating voltage, 1 μÅ for the sample current, 0.2 mm/sec. for the speed of the beam scanning, 60 μmφ for the beam aperture, and at $5.0\times10^{-5}$ Torr vacuum. This irradiation changed the insulative three layers, the second contact layer 72, the first contact layer 71, and the cladding layer 6, to each be a p-type conductive semiconductor with respective hole concentrations of $6\times10^{17}/cm^3$, $3\times10^{17}$, and $2\times10^{17}/cm^3$ and respective resistivities of 2 Ω.cm, 1 Ω.cm, and 0.7 Ω.cm. As a result, a wafer with a multiple layer structure was obtained.

A titanium (Ti) layer of about 2000 Å in thickness was formed on the second contact layer 72. A nickel (Ni) layer of about 9000 Å in thickness was formed on the Ti layer. Then, a photoresist layer was laminated on the Ni layer and a portion of the photoresist layer where an electrode pad 10 is formed was removed by photolithography. Utilizing the remaining photoresist layer as a mask, the exposed portion of the Ti layer and the Ni layer were etched by use of an acid etching liquid. Then, the remaining photoresist layer was removed. Utilizing the remaining Ti and Ni layers as a mask, the exposed portion of the layers from the second contact layer 72 down to the n-layer 4 were etched by reactive ion etching with gases containing chlorine. As a result some portion of the n+-layer 3 was exposed. The remaining Ti and Ni layers on the second contact layer 72 were then removed by use of an acid etchant.

An electrode layer 8 with a double layer structure is formed as follows.

(1) A photoresist layer 12 was uniformly laminated on the entire sample. A portion of the photoresist layer 12 where the electrode layer 8 is selected to be formed was removed in, for example, nearly a square shape so as to form a window 12A.

(2) A first electrode layer 81, comprised of Ni and having a thickness generally of 25 Å, was uniformly deposited in the window 12 Å formed on the exposed part of the second contact layer 72 and on the photoresist layer 12 under a high vacuum condition of about $10^{-7}$ Torr in a deposition chamber.

Figure 2A:
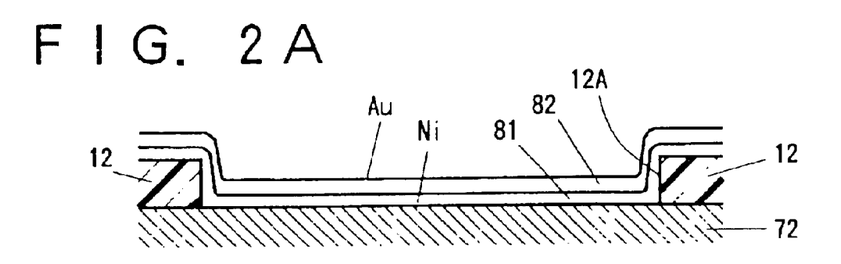
FIG. 2A is a sectional schematic illustration of a second contact layer and an electrode layer before heat treatment.

(3) A second electrode layer 82, comprised of Au and having a thickness generally of 60 Å, was uniformly deposited on the first electrode layer 81 as shown in FIG. 2A.

(4) After removal of the wafer from the chamber, portions of the Ni and Au layer that had been deposited on the photoresist layer 12 were removed by a lift-off method. Namely, the photoresist layer 12 and some portion of the Ni and Au layer thereon were removed at the same time. As a result, the transparent electrode layer 8, having a double layer structure comprising the Ni electrode layer 81 and the Au electrode layer 82, was obtained.

(5) Then, another photoresist layer was uniformly laminated on the entire wafer. A portion of the photoresist layer was removed where the electrode pad 9 with a triple layer structure is to be formed, thereby forming, for example, a window. Then, Ni, Au, and Al layers, respectively having a thickness of 1000 Å, 1.5 μm, and 300 Å, were successively and uniformly formed on the exposed portion of the Au electrode layer 82 and the photoresist layer in the reaction chamber. The wafer was then removed from the chamber, and the photoresist layer was removed by a lift-off method, which can be the same method used to form the electrode B. As a result, the electrode pad 9 comprising of a first metal layer 91 made of Ni, a second metal layer 92 made of Au, and the third metal layer 93 made of Al, was obtained. An electrode pad 10 made of Al was formed for the n+-layer by vapor deposition.

(6) The wafer was then returned to the chamber for a process of heat treatment. After the chamber was evacuated to less than 1 m Torr, and then filled with nitrogen ($N_2$) to atmospheric pressure and closed, heat treatment was carried out for a period of time ranging generally from about several seconds (more than two) to 10 min. under condition controlled by lowering the temperature to the range of about 400° C. to 700° C. Hydrogen ($H_2$), helium (He), nitrogen ($N_2$), oxygen ($O_2$), neon (Ne), argon (Ar), and krypton (Kr) or any combinations of these gases can be used as the gas for filling the chamber. The chamber may be evacuated in the range of 1 m Torr to more than atmospheric pressure.

Figure 2B:
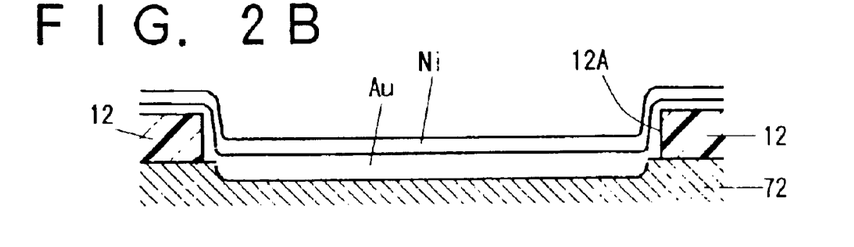
FIG. 2B is a sectional schematic illustration of the second contact layer and the electrode layer after heat treatment.
Figure 4:
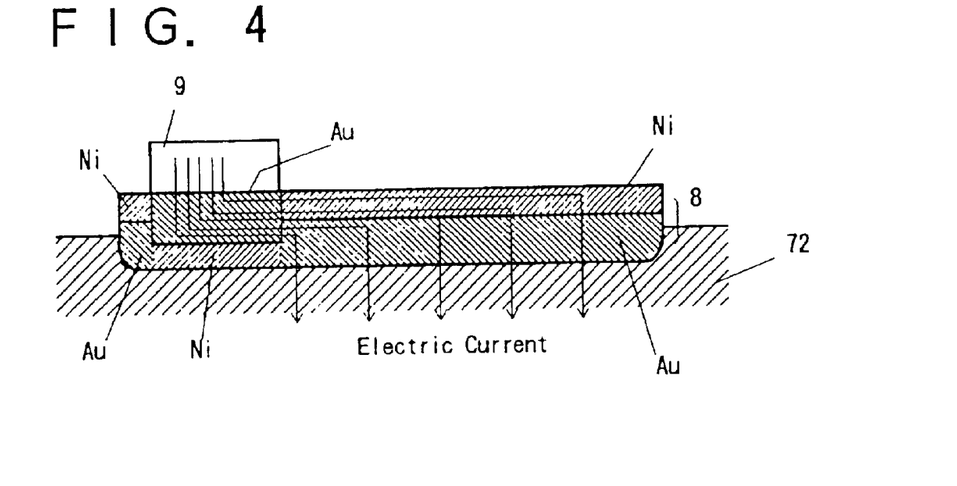
FIG. 4 is a sectional schematic illustration showing the flow of electric current through the electrode pad, the electrode layer, and the second contact layer.

As a result of the heat treatment, the element of the second electrode layer 82, for example, Au, penetrated through the first electrode layer 81 and diffused into the second contact layer 72, which comprised p GaN, thereby forming an alloy of Au and p-GaN. For example, as shown in FIGS. 2A and 2B, the vertically distribution of Au and Ni before heat treatment (FIG. 2A) was reversed after heat treatment (FIG. 2B). However, this reversal phenomenon could not be observed at some portion of the electrode, layer 8 which was under the electrode pad 9. As a result, the reversal of Ni and Au occurred in the portion of the electrode layer 8 where the electrode pad 9 was not formed thereover as shown in FIG. 4.

Figure 3:
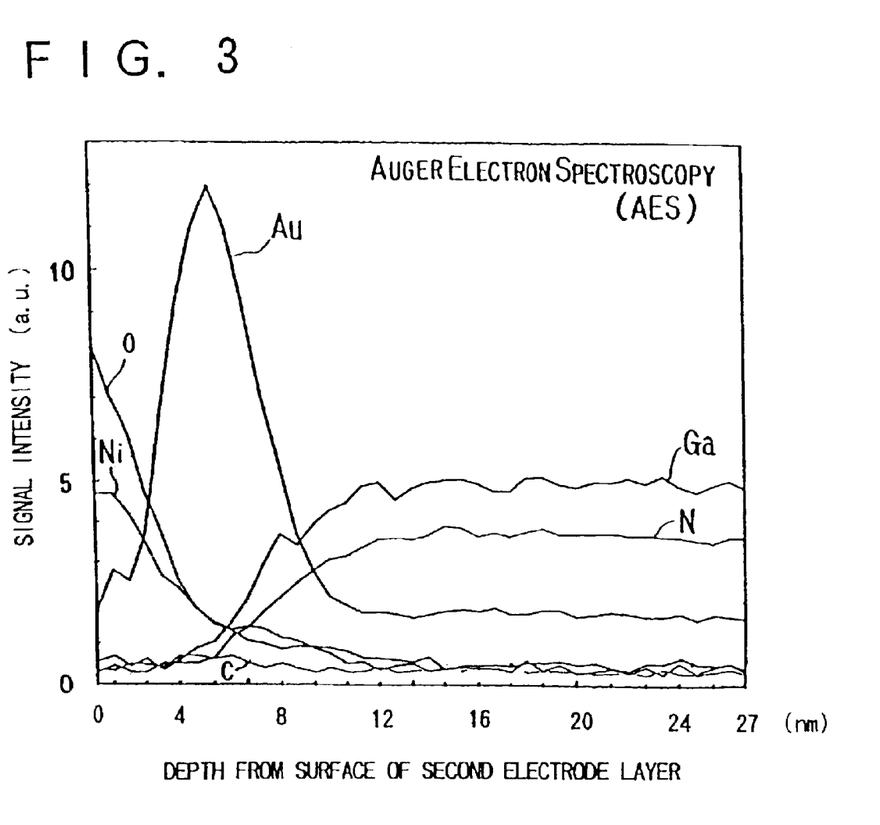
FIG. 3 is a graph showing distribution of elements in the second contact layer after beat treatment analyzed by Auger Electron Spectroscopy (AES)

FIG. 3 is a graph showing the distribution of Au, Ni, Ga, and N in the second contact layer 72 as analyzed by Auger electron spectroscopy (AES). Around from the surface of the second contact layer 72 and to about 3 nm down from its surface, the concentration of Ni was higher than that of Au. However, the concentration of Au became higher than that of Ni at a depth of more than about 3 nm from the surface of the second contact layer 72. Thus, the element Au penetrated through the first electrode layer 81 and deep into the second contact layer 72 with a high concentration to a depth of about 9 nm from its surface. As a result, an alloy of GaN and Au was formed in the second contact layer 72.

The reversal of the element distribution appears to be caused by the fact that the element of the first electrode layer 81 has an ionization potential that is relatively lower than that of the second electrode layer 82. By using the method discussed above, the element of the first electrode layer 81 moves up towards the surface of the second electrode layer 82 and thus, the element of the second electrode layer 82 moves down and penetrates through the first electrode layer 81 into the GaN layer thereby forming an alloy of GaN and Au. Since the element of the second electrode layer 82 has an ohmic characteristic better than that of the first electrode layer 81, the alloy formed of GaN and Au enhances the ohmic characteristics of the electrode to the device 100. Further, since the element of the first electrode layer 81 which has a relatively lower ionization potential than that of the second electrode layer 82 is more reactive than that of the second electrode layer 82, the element of the first electrode layer 81 can be strongly connected to the Group III nitride compound semiconductor device. As a result, the adhesive strength between the electrode layer 8 and the device 100 is improved.

Alternatively, at least one of palladium (Pd), iridium (Ir), and platinum (Pt) can be used instead of, or in addition to, gold (Au) as the element of the second electrode layer 82. At least one of iron (Fe), copper (Cu), chromium (Cr), tantalum (Ta), vanadium (V), manganese (Mn), aluminum (Al), and silver (Ag) can be used as the element of the first electrode layer 81 in stead of, or in addition to, nickel (Ni).

Further, an element that has an occlusion characteristic with respect to hydrogen (H) may be selected as the first electrode layer 81. An electrode layer 81 with this characteristic occludes H from the surface layer of the device that is formed beneath the first electrode layer 81, and thus, improves the crystallinity of the surface layer.

Then, a silicon oxide film ($SiO_2$), serving as a protection film 11, was uniformly formed on the entire sample by electron beam vapor deposition. Through processes including laminating a photoresist layer, patterning by photolithography, and removing some portions of the protection film 11 by wet etching, windows 9A and 10A were formed in, for example, nearly a square shape. Electrode pads 9 and 10 were respectively formed in windows 9A and 10A. The remaining photoresist layer was then removed.

Since the adhesive strength between the third metal layer 93 made of Au and the protection film 11 is strong, etching liquid is prevented from permeating therebetween. The portion of the protection film 11 covered with the photoresist layer remained unetched and accordingly sides of the windows 9A and 10A remain unetched horizontally. As a result, the protection film 11 completely and fully protected the sides of the first metal layer 91, the second metal layer 92, and the third metal layer 93.

Alternatively, one of Ni and Ti may be selected as an element of the third metal layer 98 that has adhesion strength to the protection film 11 which is stronger than that of the second metal layer 92, or Au. As an alternate, silicon nitride ($Si_3N_4$) may be used as a material of the protection film 11.

Al is preferable as the material of the third metal layer 93. Similar to the elements of the electrode layer 8, a reversal in the distribution of the elements of the metal layer 9 was observed. The Ni of the first metal layer 91 moved up through the second metal layer 92 and partly appeared to its surface. When Al was used as the material of the third metal layer 93, the Ni of the first metal layer 91 did not appear through the third metal layer 93. In contrast, however, the element of the first metal layer 91 appeared to and made patches on surface of the third metal layer 93 when each of Ni and Ti was used as the material of the third metal layer 93.

The wafer treated with the above-mentioned process was divided or diced to form separate chips or elements including the device 100 as shown in FIG. 1.

FIG. 4 shows the flow of electric current through the electrode pad 9, the electrode layer 8, and the second contact layer 72. Under the electrode pad 9, because Ni is in direct contact with the second contact layer 72, the electrode layer 8 has a higher contact resistance and electric current flows through other parts of the electrode layer 8 with a lower contact resistance where Au is in direct contact with the second contact layer 72. Accordingly, electric current does not flow under the electrode pad 9 where emitted light would be shielded thereby even if there are any emission and electric current is allocated to other parts where emitted light extends to outside of the device 100. Consequently, an effective current density is enhanced and, thus, luminous efficiency is improved.

The obtained device 100 was found to have a luminous intensity of 2000 mod and a peak wavelength of 450 nm in the luminous spectrum at a driving current of 20 mA. Luminous intensity of the device 100 of the present invention doubled compared with that of a conventional device.

When improving luminous efficiency is a priority, the electrode pad 9 may have a single layer made of one of Ni, Au, and Al or a double layer made of two of Ni, Au, and Al. Further, the protection film 11 may not be necessary when improving luminous efficiency is a priority.

The thickness of the first electrode layer 81 should preferably be about 5 Å to 200 Å. When the first electrode layer 81 is thinner than 5 Å, its adhesive strength becomes weak. When it is thicker than 200 Å, its transparency worsens.

The thickness of the second electrode layer 82 should preferably be about 5 Å to 200 Å. When the second electrode layer 82 is thinner than 5 Å, its contact resistance becomes high. When it is thicker than 200 Å, its transparency becomes worsen.

The thickness of the first metal layer 91 should preferably be about 20 Å to 5 µm. When the first metal layer 91 is thinner than 20 Å, its adhesive strength becomes weak. When it is thicker than 5 µm, it takes too much time to form.

The thickness of the second metal layer 92 should preferably be about 100 Å to 5 µm. When the second metal layer 92 is thinner then 100 Å, its reliability for wire bonding is lowered. When it is thicker than 5 µm, it takes too much time and cost to form.

The thickness of the third metal layer 93 should preferably be about 10 Å to 5 µm. When the third metal layer 93 is thinner than 10 Å, its adhesive strength becomes weak and it is unable to prevent the sides of the protection film 11 from being etched. When it is thicker than 5 µm, it takes too much time to form. Further, when one of Ni and Ti is used as the material of the third metal layer 93, its thickness should preferably be about 10 Å to 500 Å. When it is thicker than 500 Å, reliability for wire bonding is lowered.

In the above embodiment, the electrode pad 9 was formed on the electrode layer 8. Alternatively, the electrode pad may be formed directly on a p-type group III nitride compound semiconductor layer.

While the invention has been described in connection with specific exemplary embodiments, it is to be understood that the invention is not to be limited to the disclosed embodiments. Rather, the present invention is intended to include various modifications and equivalent arrangements as those that are within the spirit and scope of the appended claims.

What is claimed is:

1. A light-emitting semiconductor device having a Group III nitride compound semiconductor comprising:
   a surface layer made of p-type conduction;
   an electrode layer formed on said surface layer; and
   an electrode pad comprising:
      a first metal layer formed on said electrode layer formed on said surface layer, a second metal layer formed on said first metal layer, and a third metal layer formed on said second metal layer; and
      a protective film over said third metal layer and entirely of said electrode layer, said protective film leaving exposed a central portion of said third metal layer; said electrode layer being capable of passing an emitted light;
   said electrode pad being capable of supplying a current to said electrode layer; and
   wherein said second metal layer is made of gold (Au), said first metal layer comprises at least one of iron (Fe), copper (Cu), chromium (Cr), tantalum (Ta), vanadium (V), manganese (Mn), aluminum (Al), and silver (Ag), and said third metal layer comprises aluminum (Al) that has an adhesiveness to said protection film which is stronger than gold (Au) and etching an inner side of said protective film is prevented when a portion of said protective film corresponding to said central portion is etched and said protective film is left on an upper surface of said third metal layer except for said central portion.

2. The light-emitting semiconductor device according to claim 1, wherein said material of said first metal layer includes at least one of vanadium (V) and chromium (Cr).

3. The light semiconductor device according to claim 1, wherein said protection film is made of silicon oxide ($SiO_2$).

4. The light-emitting semiconductor device according to claim 1, wherein said electrode layer has a multi-layer structure having at least a first electrode layer formed on said surface layer and a second electrode layer formed on said first electrode layer wherein said first electrode layer comprises material having an ionization potential that is lower than that of said second electrode layer, said material of said second electrode layer, has an ohmic characteristic to said surface layer better than that of said first electrode layer, and said material of said second electrode layer being distributed more deeply into said surface layer than that of said first electrode layer by heat treatment.

5. The light-emitting semiconductor device according to claim 4, wherein said material of said first electrode layer includes at least one of nickel (Ni), iron (Fe), copper (Cu), chromium (Cr), tantalum (Ta), vanadium (V), manganese (Mn), aluminum (Al), and silver (Ag), and said material of said second electrode layer includes at least one of palladium (Pd), gold (Au), iridium (Ir), and platinum (Pt).

6. The light-emitting semiconductor device according to claim 4, wherein said material of said first electrode layer is nickel (Ni) and said of said second electrode layer is gold (Au).

7. The light-emitting semiconductor device according to claim 4, wherein said heat treatment is carried out in the range of 400° C. to 700° C.

8. The light-emitting semiconductor device according to claim 1, further comprising:
semiconductor layers having Group III nitride compound semiconductor and satisfying the formula, $Al_xGa_yIn_{1-N-Y}N$, wherein $0<x<1$, $0<Y<1$, and $0<x+Y<1$, $0<x<1$, $0<Y<1$, and $0<x-Y<1$.

9. The light-emitting semiconductor device according to claim 8, wherein said device is one of a light-emitting diode (LED) and a light-emitting laser diode (LD).

10. The light-emitting semiconductor device according to claim 4, wherein materials of said second electrode layer do not permeate into said first electrode layer directly under said electrode pad, which enables the interface between said electrode layer and said surface layer directly under said electrode pad to have a large resistivity and not have electric current pass therethrough.

* * * * *

UNITED STATES PATENT AND TRADEMARK OFFICE
CERTIFICATE OF CORRECTION

PATENT NO.     : 6,734,468 B2
DATED          : May 11, 2004
INVENTOR(S)    : Toshiya Uemura et al.

It is certified that error appears in the above-identified patent and that said Letters Patent is hereby corrected as shown below:

Column 10,
Line 64, should read:
4. The light-emitting semiconductor device according to claim 1, wherein said electrode layer has a multi-layer structure having at least a first electrode layer formed on said surface layer and a second electrode layer formed on said first electrode layer, wherein said first electrode layer comprises material having an ionization potential that is lower than that of said second electrode layer, said material of said second electrode layer, has an ohmic characteristic to said surface layer better than that of said first electrode layer, and said material of said second electrode layer being distributed more deeply into said surface layer than that of said first electrode layer by heat treatment.

Signed and Sealed this

Seventeenth Day of May, 2005

JON W. DUDAS
*Director of the United States Patent and Trademark Office*